US005526305A

United States Patent [19]
Levi

[11] Patent Number: 5,526,305
[45] Date of Patent: Jun. 11, 1996

[54] TWO-TRANSISTOR DYNAMIC RANDOM-ACCESS MEMORY CELL

[75] Inventor: Mark W. Levi, Utica, N.Y.

[73] Assignee: The United States of America as represented by the Secretary of the Air Force, Washington, D.C.

[21] Appl. No.: 265,463

[22] Filed: Jun. 17, 1994

[51] Int. Cl.$^6$ ................................................. G11C 11/34
[52] U.S. Cl. .......................... 365/174; 365/188; 365/149
[58] Field of Search .................................. 365/174, 149, 365/150, 182, 187, 188

[56] References Cited

U.S. PATENT DOCUMENTS 3,513,365  5/1970  Levi ............................ 365/149
3,634,825  1/1972  Levi ............................ 365/149
3,706,079  12/1972  Vadasz et al. ................. 365/150

Primary Examiner—A. Zarabian
Attorney, Agent, or Firm—George E. Kersey; William G. Auton

[57] ABSTRACT

A dynamic random access memory circuit for storing an information signal using both a data input line and a data output line for a two-transistor dynamic ram cell memory circuit is disclosed. The circuit is incorporated into an integrated circuit array of similar cells. Because of the nature of the circuitry, the data input and output lines of each cell in the array are laid out in parallel, and the data-out line of one random access memory cell becomes the data-in line of the adjacent random access memory cell. Thus, while the addition of a separate line for data-in and data-out adds structure to a single cell, it reduces the overall structure of an array of such cells, and results in a more compact construction of a memory array.

14 Claims, 3 Drawing Sheets

FIG. 2A
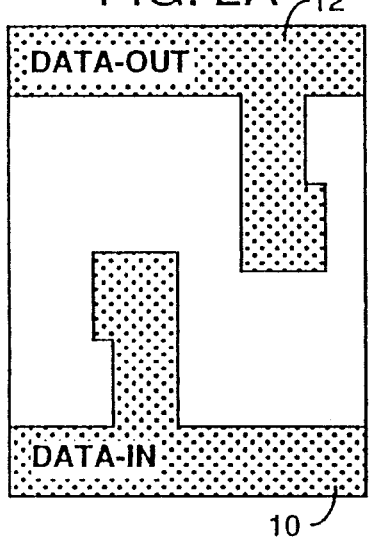
FIG. 2B
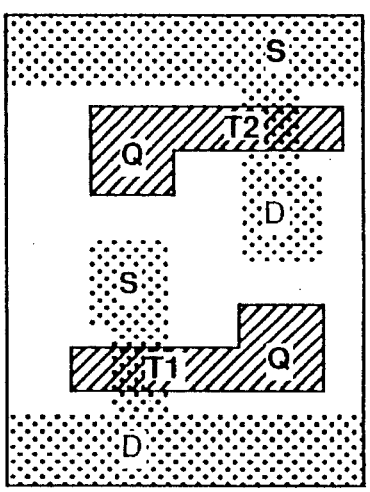
FIG. 2C
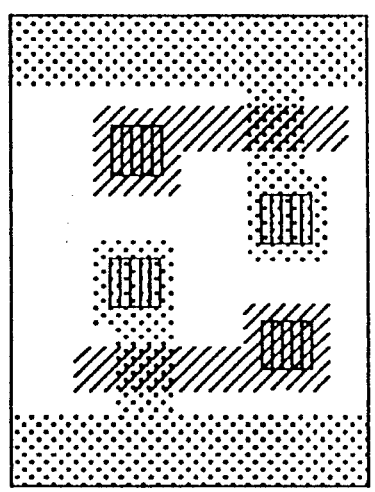
FIG. 2D
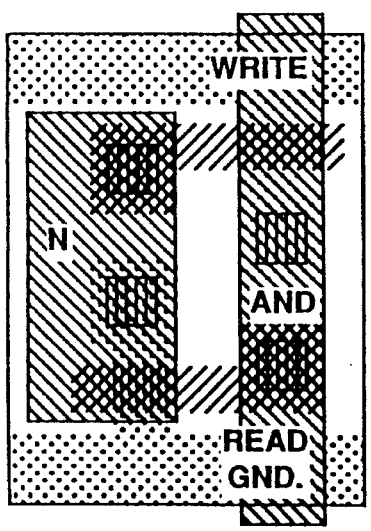
FIG. 2E
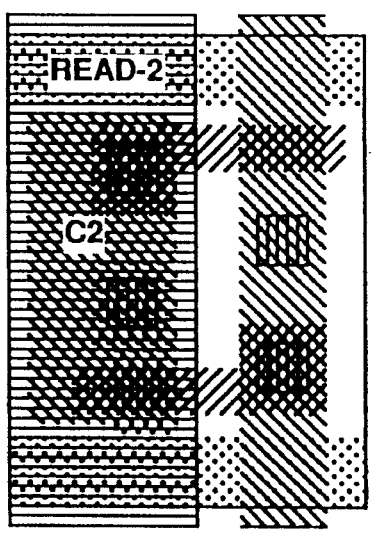
FIG. 2F
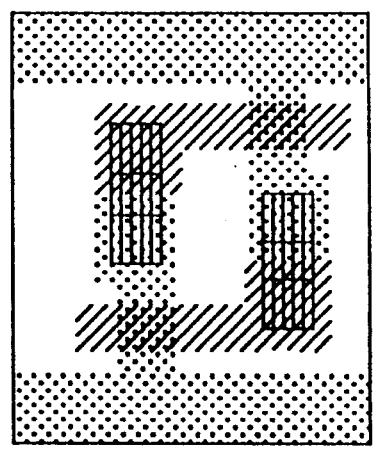
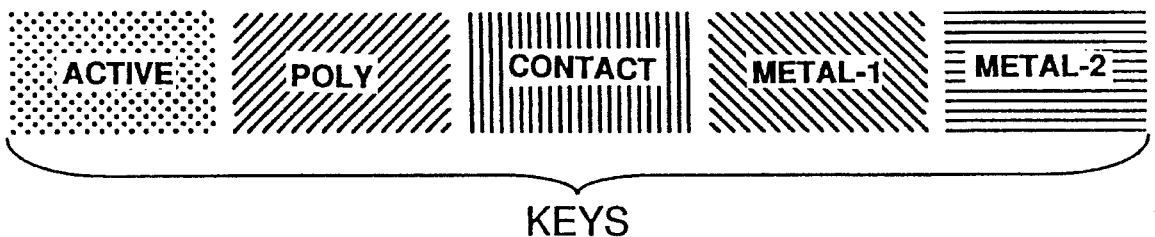
KEYS
FIG. 2

TWO-TRANSISTOR DYNAMIC RANDOM-ACCESS MEMORY CELL

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to semiconductors and more specifically the invention pertains to a circuit for semiconductor dynamic random access memory (DRAM) cells which is an improvement on previously known two-transistor cells by requiring fewer access terminals and permitting more compact layout of the cells.

My previous U.S. Pat. Nos. 3,513,365 and 3,634,825 describe two-transistor DRAM's which can be used as crosspoints, as non-destructive readout DRAM or, by using two cells per bit, as associative memory. The design and operation of those cells required two or three connections in the word direction of an array and one connection in the data direction for each cell. The present invention is an improvement over my prior patents in that it is capable of performing the same functions of the prior art while permitting a more compact layout of the integrated circuits, thereby providing a reduction in size of the circuits.

SUMMARY OF THE INVENTION

The present invention is a dynamic random access memory circuit for storing an information signal using both a data input terminal and a data output terminal for a two-transistor dynamic ram cell memory circuit. The invention is circuit modification of a cell which is incorporated into an integrated circuit array of similar cells. Because of the nature of the circuitry, the data input and output terminals of each cell in the array are laid out in parallel, and the data-out terminal of one random access memory cell becomes the data-in terminal of the adjacent random access memory cell. Thus, while the addition of a separate terminal for data-in and data-out adds structure to a single cell, it reduces the overall structure of an array of such cells, and results in a more compact construction of a memory array.

Each cell in an array of cells comprises first and second memory transistors, connected in a manner similar to that shown in my prior U.S. Pat. No. 3,513,365. I improve that invention by connecting a source/drain electrode of the second transistor to a separate data-out terminal, and by connecting the other source/drain terminal of the second transistor to the gate electrode of the first transistor, thereby eliminating one connecting line in the column direction. This permits the layout of the integrated circuits in an array of cells to have structurally parallel data-in terminals and data-out terminals, the data-out terminal of one cell being the data-in terminal of an adjacent cell in an array of cells.

It is one object of the invention to provide a dynamic random access memory circuit controlled by a reversibly controlled voltage signal in which there are separate data-in and data-out terminals, the data-out terminal of one circuit providing the data-in terminal for a adjacent circuit.

It is another object of the present invention to provide a method for controlling a voltage controlled element.

These objects together with other objects, features and advantages of the invention will become more readily apparent from the following detailed description when taken in conjunction with the accompanying drawings wherein like elements are given like reference characters throughout.

DESCRIPTION OF THE DRAWINGS

FIG. 2 is an illustration of the keys used in the layers of FIGS. 2A–2F;

FIGS. 2A through 2F show a layout of relevant layers of a single cell; and

DETAILED DESCRIPTION OF THE PREFERRED EMBODIMENT

Figure 1A:
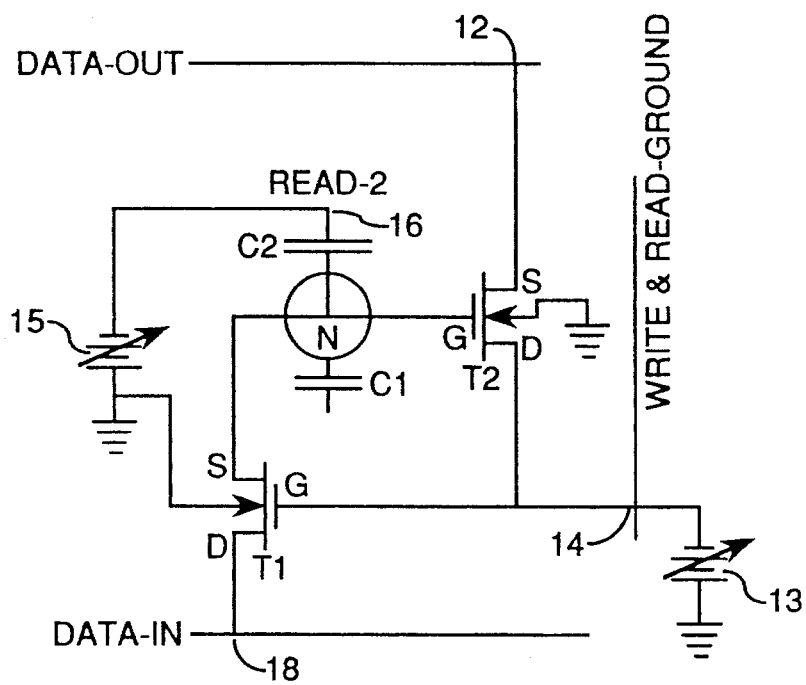
FIG. 1A represents an electrical schematic of the present invention.

FIGS. 1A and B represent an improvement over the cells disclosed in my prior U.S. Pat. No. 3,515,365. Basically the difference between the earlier cell and that shown in FIG. 1 is obtained by separating the data-in/data-out terminal into two separate terminals, a data-in terminal and a data-out terminal, and making the write terminal of the prior art common to the prior read terminal. This arrangement might appear to be a disadvantage by requiring two data terminals for each cell in a column of cells (a column of cells is a set of cells sharing common read 2 and write/read-gnd terminals). However, the data-in terminal of one row of cells is merged with the data-out terminal of an adjacent row of cells so that only one extra data terminal is required for an entire array of cells. In essence, therefore, there is no material increase in the number of terminals, and furthermore, the increased internal symmetry of the cell which results from this variation combined with the elimination of isolation space between cells along a column, and elimination of a separate write connection actually permits layout in a smaller area than the prior art system which uses a single data-in/data-out terminal, and separate read and write terminals.

The arrangement shown in FIGS. 1A provides a dynamic random access memory circuit for storing an information signal, and utilizes a data-in terminal 10 which receives an information signal, a voltage representing either a logical "1" or a logical "0", and a data-out terminal 12 upon which an inverted output voltage representing a logical "0" or "1" is produced.

The circuit includes two memory transistors T1 and T2 each having a gate electrode G, a source electrode S and a drain electrode D. In practice the source and drain terminals are interchangeable elements so that they are sometimes referred to herein as source/drain (S/D) electrodes. There are at least first and at least one second-voltage driving sources 13 and 15 which respectively output first and at least one second-voltage driving signals at terminals 14 and 16, respectively. The gate terminal G of transistor T1 is connected to the drain electrode of the transistor T2 and to the first voltage driving source 13. The source terminal S of the transistor T2 is connected to the data-out terminal 12. The drain electrode D of transistor T1 is connected to the data-in terminal 12, while the source electrode S of transistor T1 is connected to the gate electrode G of transistor T2, forming an electrical node N. The node N includes a capacitance C2 connected to each second-driving source 15, and capacitance C1 which is comprised of distributed capacitance between the node N and the remainder of its surroundings.

In operation, the first driving voltage source is adjusted so as to cause the first transistor T1 to become conductive between its source and drain electrodes thereby causing any information voltage data signal on the data-in terminal 10 to be placed on the node N and causing the capacitances C1 and C2 to be charged to the voltage on the data-in terminal 10. The voltage being placed on the node is selected to be of such value that the transistor T2 is non-conductive. The voltage of the first driving source is then changed to make the first transistor non-conductive, and the first source/drain of the second transistor to function as a source voltage corresponding to a logical zero. This effectively traps the voltage on the node N whereby it is maintained at the level of the voltage (a logical "0" or "1") on the data-in terminal 10, thus storing the information voltage upon the node N.

Subsequently a voltage and second charge is placed on said data-out terminal, and one or more of the said second-driving voltages is changed so as to induce an additional voltage upon the node N via the capacitance C2 such that said second transistor T2 conducts only if said stored information voltage is a voltage which represents a logical "1", and will not become conductive if said voltage represents a logical "0", whereby the voltage of data-out terminal 12 will be set to a logical complement of said stored information. Thereafter, the second driving voltage is varied such that the voltage upon the node N returns to the value prior to the first-changing and the second transistor becomes non-conductive.

Figure 1B:
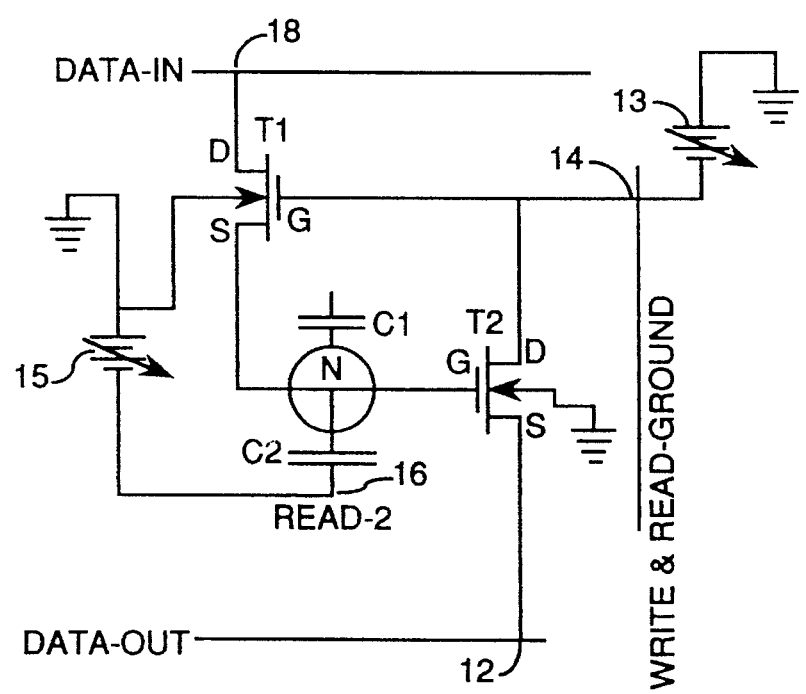
FIG. 1B represents an inverted cell of the same invention.

FIG. 1B is electrically identical to that shown in FIG. 1A, and it represents one cell of "upside-down" or inverted cells which would be included in an array of columns and rows of such cells. In operation, the terminal 10 of the cell in FIG. 1A is connected to the terminal 12 in the cell of FIG. 1*b*, while the terminal 12 of the cell in FIG. 1A is connected to the terminal 10 in the cell of FIG. 1B. This results in the restoration of an ordinary cell to its original state after its state is read, the inverted output of the ordinary cell then is read into the inverted cell, whose inverted output then is read back into the original ordinary cell.

A partial layout of a single cell which is included in an array of many of such cells is shown in FIG. 2A through 2E, which show a layout of the relevant layers of the cell. Using the terminology and rules of MOSIS scalable layout, these figures show the following:

FIG. 2A shows the active area portions not masked by poly-silicon which become source/drain conductor;

FIG. 2B shows poly-silicon forming the gates and connecting areas;

FIG. 2C shows the contact holes in a layer of insulator (oxide);

FIG. 2D shows a first metal connecting the source of transistor T1 to the gate of transistor T2, and providing most of the plate of Capacitor C2 connected to the node N; and further, first metal connecting the drain of transistor T2 to the gate of transistor T1, while simultaneously providing the write/read-Ground terminal through a column of cells; and FIGS. 2E shows a second metal, separated from the other layers by an insulation layer(which is the dielectric of capacitor C2, and simultaneously providing the other plate of capacitor C2 and the Read-2 terminal through the same column of cells.

FIGS. 2A–E are provided to show a layout using MOSIS rules for a particular process and to illustrate the topological advantages of the disclosed circuit. FIG. 2 is an illustration of the keys used in the layers of FIGS. 2A–2F. Other process rules may also be used, and FIG. 2F illustrate how additional compaction of cell layout is achieved by "breaking" one MOSIS layout rule, i.e. that rule requiring a minimum spacing between active contact and poly-silicon contact. The MOSIS rules are designed to make it possible to have many different semiconductor foundries using different processes to make the same part. The rules constitute a least common denominator. The cells could be further compacted using a process specifically designed for that purpose while retaining the electrical circuit.

As seen in FIG. 2B, the symmetry of the two transistors T1 and T2 in each of the cells is apparent, and as can be seen the data-in terminal 10 in cell A is parallel to the data-out terminal 12 of cell A, and is in a physical position to supply the data-in to the next cell B in an array of cells. In each cell, the data-in terminal 10 is actually the data-out terminal 12 of an adjacent cell. With a column of such cells, it will be apparent that only one additional terminal is used for the whole column, and with the symmetry provided, much space in each cell, and in the overall array is saved, and this separation of inputs from outputs actually simplifies peripheral circuitry required for restoring the information currently in a column when it is desired that only a portion of the information in the column be rewritten while the remainder is retained, which is the operation of a memory array. This results from the inversion between write and read. A minimum of one inversion is always required to obtain amplification. Consequently two inversions are required to obtain amplification without inversion. Since the cell inverts, only one additional inversion is required for restoring purposes. In fact, a column of upside down cells, as shown in FIG. 1B, can be used to perform this function. That is, if a column of cells accepts information on data terminal 10 (cell A) and is read via data terminal 12, then a column of upside down cells which accepts information from data terminal 12 and is read via data terminal 10 will restore the information on the data terminals if it is written from the inverted data remaining on the data terminals after a read and then read itself, followed by writing levels only into the data terminals to be changed. The only requirement would be that the precharge level of the data terminals be the same as the high level for writing.

Figure 3:
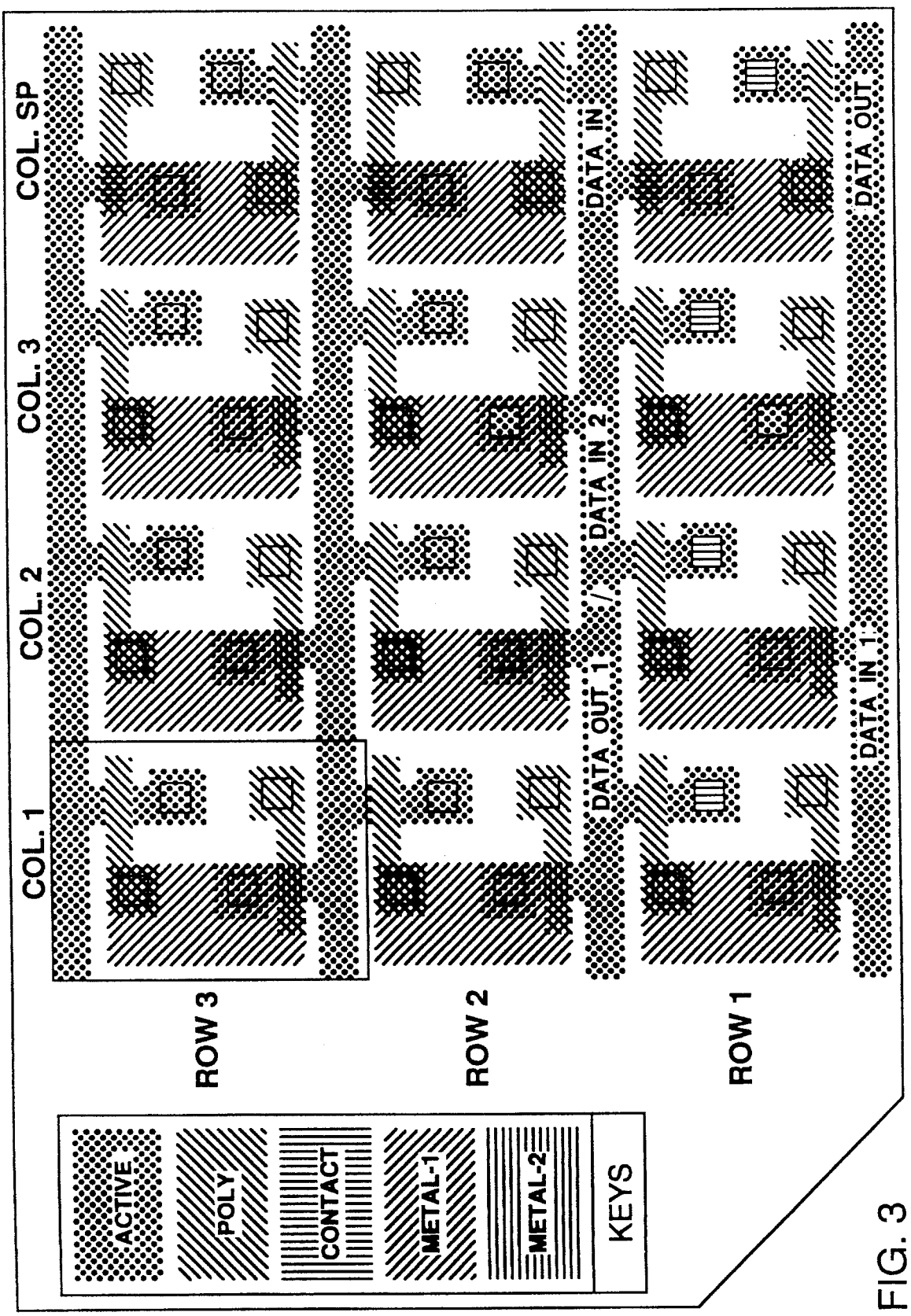
FIG. 3 shows an array of three columns of three rows of cells, and an additional special column of inverted cells.

FIG. 3 shows a topologically rectangular array of three columns and three rows of cells, and an additional "special" column of inverted (or upside-down) cells for which the data-in and data-out terminals in a row are, respectively, the data-out and data-in terminals of the other cells of the same row. Row 3, column 1 is outlined showing the merging of the data-out terminal of row 2 with the data-in terminal of row 3. These features are independent of the particular process. For clarity, only the data terminal, transistors, contacts and the node portion of the first metal are shown.

The new features and advantages are the simplification of the cell and peripheral circuitry required for arrays of cells, the reduction in area from the simplification and reduction in number of access lines for the cells. An advantage shared with the previous inventions U.S. Pat. Nos. 3,515,365 and 3,634,825 is the improvement relative to one-transistor dynamic RAM cells as critical dimensions are made smaller. The one-transistor cell requires that the capacitance of the storage node not be significantly reduced as the critical dimensions and size of the cell is reduced. This is caused by the fact that the stored charge is the actual readout signal. These two-transistor cells have no such requirement and a calculation of the output charge available gives the two micron minimum geometry two-transistor cell an advantage of about a factor of one hundred over the one-transistor cell for a read time of one nanosecond and more as geometries are reduced further or read time increased. This really counts at very small geometries where the gyrations and complications in process (such as trenches and/or stacked capacitors) needed to retain the minimum capacitance are not needed for the two-transistor cells. This should give greater yields in practice. Layout of such cells has been done on a CAD station and an area per cell of 9×8 minimum geometry elements has been achieved within the design rules of scalable geometry processes. This is significantly smaller than the 10×10 layout achieved for the previous two-transistor cells.

Variations could include interchange of semiconductor, using P-channel transistors rather than N-channel and reversing the polarity of the signals. The substrate could be a well. Various processes could be used for realizing the circuits.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A dynamic random access memory cell for storing and retrieving an information signal, comprising:

separate data-in and data-out terminals, a write & read-ground terminal and at least one read-2 terminal;

first and second transistors, each having a gate electrode and first and second source/drain electrodes;

the gate electrode of the first transistor being directly connected to the first source/drain electrode of the second transistor and to said write & read-ground terminal, and the first source/drain electrode of said first transistor being connected to said data-in terminal; and the second source/drain terminal of said second transistor being directly connected to the data-out terminal, and the gate electrode of said second transistor being directly connected to the second source/drain electrode of said first transistor forming an electrical node having capacitances to said read-2 terminal.

2. A dynamic random access memory cell for storing and retrieving an information signal, comprising:

a data-in terminal which receives an information signal;

a data-out terminal upon which an output signal can be produced;

a write & read-ground terminal and at least one read-2 terminal;

a first and a second memory transistor, each memory transistor having a gate electrode and first and second source/drain electrodes, the gate electrode of the first transistor being connected to the first source/drain electrode of the second transistor and to said write/read-ground terminal, the second source/drain terminal of the second transistor being connected to the data-out terminal, the first source/drain electrode of said first transistor being connected to said data-in terminal, and the second source/drain electrode of said first transistor being connected to the gate electrode of said second transistor forming an electrical node, said note having capacitances to said at least one read-2 terminal, and first and at least one second voltage driving sources which respectively output first and one second voltage driving signals;

means for adjusting said first voltage driving source so as to cause said first transistor to become conductive between its source and drain electrodes thereby causing any information voltage representing information on said data-in terminal to be placed on said node and said capacitances to be charged to said information voltage on said data-in terminal, the voltage on said node being of such value that said second transistor is non-conductive, the voltage of the first driving source then being changed to make the first transistor non-conductive, and the first source/drain of the second transistor to function as a source, whereby said voltage on said node is maintained at the level of said information voltage on said data-in terminal, and the information voltage on said data-in terminal is stored upon said node, and said second transistor is non-conductive;

means for subsequently providing a voltage and charge upon said data-out terminal, and means for thereafter first-changing at least one of said second-voltage-driving sources such as to induce an additional voltage upon said node via said capacitances such that said second transistor conducts only if said stored information voltage is a voltage which may be stored upon said node, and will not become conductive if said stored information voltage is a lower voltage than the voltage which may be so stored, whereby the information of the information voltage on said node can be discerned on said data-out terminal;

the first-changing means subsequently changing the second voltage driving signal such that the voltage upon said node returns to its value prior to the voltage of said first driving source being changed and such that said second transistor becomes or remains non-conductive.

3. The dynamic random access memory cell of claim 2, wherein the discerned information on the data-out terminal resulting from reading a stored logical 1 is represented by a voltage which is substantially the same as the input voltage which represents an input logical 0, and where the discerned information on the data-out terminal resulting from reading a stored logical 0 is represented by a voltage which is substantially the same as the input voltage which represents an input logical 1.

4. The dynamic random access memory cell of claim 1 wherein said data-in terminal and said data-out terminal are positioned in spaced parallel relationship in said cell, and said transistors are disposed between said terminals to provide a compact integrated circuit.

5. The dynamic random access memory cell of claim 2 wherein said data-in terminal and said data-out terminal are positioned in spaced parallel relationship in said cell, and said transistors are disposed between said terminals to provide a compact integrated circuit.

6. The dynamic random access memory cell of claim 3 wherein said data-in terminal and said data-out terminal are positioned in spaced parallel relationship in said cell, and said transistors are disposed between said terminals to provide a compact integrated circuit.

7. A plurality of integrated dynamic random-access memory cells according to claim 4, where said cells are arranged as a topologically linear array, and wherein the data-out terminal of all but one cell is also the data-in terminal of an adjacent cell in said array, whereby the symmetry of the connections in conjunction with the parallel relationship of said data-in and data-out terminals provides improved compactness for each cell for said array.

8. A plurality of integrated dynamic random-access memory cells according to claim 5, where said cells are arranged as a topologically linear array, and wherein the data-out terminal of all but one cell is also the data-in terminal of an adjacent cell in said array, whereby the symmetry of the connections in conjunction with the parallel relationship of said data-in and data-out terminals provides improved compactness for each cell for said array.

9. A plurality of integrated dynamic random-access memory cells according to claim 6, where said cells are arranged as a topologically linear array, and wherein the data-out terminal of all but one cell is also the data-in terminal of an adjacent cell in said array, whereby the symmetry of the connections in conjunction with the parallel relationship of said data-in and data-out terminals provides improved compactness for each cell for said array.

10. A plurality of dynamic random-access memory cells each constructed in accordance with claim 1, said cells being arranged as a topologically rectangular array with a number N of columns, and a number M of rows, and a first of the read-2 terminal of each of the cells in a column being connected together and driven by the second-voltage driving source for said column, and the write/read-ground terminals of each cell in said column being connected together and driven by the first voltage driving source for said column, and wherein each cell in a column, except the Mth, has its data-output terminal in common with the data-input terminal of an adjacent cell in that column, and wherein the cells of each row in said array have their data-in terminals in common to form a data input terminal for said row, and the cells of each row have their data-out terminals in common to form a data output terminal for said row.

11. A plurality of dynamic random-access memory cells each constructed in accordance with claim 2, said cells being arranged as a topologically rectangular array with a number N of columns, and a number M of rows, and a first of the read-2 terminal of each of the cells in a column being connected together and driven by the second-voltage driving source for said column, and the write/read-ground terminals of each cell in said column being connected together and driven by the first voltage driving source for said column, and wherein each cell in a column, except the Mth, has its data-output terminal in common with the data-input terminal of an adjacent cell in that column, and wherein the cells of each row in said array have their data-in terminals in common to form a data input terminal for said row, and the cells of each row have their data-out terminals in common to form a data output terminal for said row.

12. A plurality of dynamic random-access memory cells each constructed in accordance with claim 3, said cells being arranged as a topologically rectangular array with a number N of columns, and a number M of rows, and a first of the read-2 terminal of each of the cells in a column being connected together and driven by the second-voltage driving source for said column, and the write/read-ground terminals of each cell in said column being connected together and driven by the first voltage-driving source for said column, and wherein each cell in a column, except the Mth, has its data-output terminal in common with the data-input terminal of an adjacent cell in that column, and wherein the cells of each row in said array have their data-in terminals in common to form a data input terminal for said row, and the cells of each row have their data-out terminals in common to form a data output terminal for said row.

13. A plurality of dynamic random-access memory cells each constructed in accordance with claim 3, said cells being arranged as a topologically rectangular array with a number N of columns, and a number M of rows, and a first of the read-2 terminal of each of the cells in a column being connected together and driven by the second-voltage driving source for said column, and the write/read-ground terminals of each cell in said column being connected together and driven by the first voltage-driving source for said column, and wherein each cell in a column, except the Mth, has its data-output terminal in common with the data-input terminal of an adjacent cell in that column, and wherein the cells of each row in said array have their data-in terminals in common to form a data input terminal for said row, and the cells of each row have their data-out terminals in common to form a data output terminal for said row, and wherein a special column of said cells is arranged with the data input terminal of the cell in each row of said special column connected in common with the output terminals of the remaining cells in said row of said array, and its output terminal connected in common with the input terminal of the remaining cells of said row in said array.

14. A plurality of dynamic random-access memory cells each constructed in accordance with claim 3, said cells being arranged as a topologically rectangular array with a number N of columns, and a number M of rows, and a first of the read-2 terminal of each of the cells in a column being connected together and driven by the second-voltage driving source for said column, and the write/read-ground terminals of each cell in said column being connected together and driven by the first voltage driving source for said column, and wherein each cell in a column, except the Mth, has its data-output terminal in common with the data-input terminal of an adjacent cell in that column, and wherein the cells of each row in said array have their data-in terminals in common to form a data input terminal for said row, and the cells of each row have their data-out terminals in common to form a data output terminal for said row, and wherein a special column of said cells is arranged with the data input terminal of the cell in each row of said special column connected in common with the output terminals of the remaining cells in said row of said array, and its output terminal connected in common with the input terminal of the remaining cells of said row in said array, and whereby the information in an ordinary column of cells of the array is refreshed by reading the data in said ordinary column of the cells, and writing the voltages (as inverted and shifted data) into the special column, and then reading the special column and writing re-inverted (original) shifted data back into said ordinary column of the array.

* * * * *